United States Patent
Bottomfield (10) Patent No.: US 6,195,621 B1
(45) Date of Patent: *Feb. 27, 2001

(54) NON-INVASIVE SYSTEM AND METHOD FOR DIAGNOSING POTENTIAL MALFUNCTIONS OF SEMICONDUCTOR EQUIPMENT COMPONENTS

(76) Inventor: Roger L. Bottomfield, 1461 W. Tara Dr., Gilbert, AZ (US) 85233

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/247,143

(22) Filed: Feb. 9, 1999

(51) Int. Cl.[7] .................................................. G06F 11/30
(52) U.S. Cl. ........................................... 702/183; 702/56
(58) Field of Search .............................. 702/33, 35, 36, 702/39, 56, 182, 183, 185, 189–195

(56) References Cited

U.S. PATENT DOCUMENTS

| 4,184,205 | * | 1/1980 | Morrow ................................. 702/34 |
| 4,366,544 | | 12/1982 | Shima et al. ......................... 364/550 |
| 4,380,172 | | 4/1983 | Imam et al. ............................ 73/659 |
| 4,402,054 | * | 8/1983 | Osborne et al. ..................... 702/181 |
| 4,520,674 | | 6/1985 | Canada et al. ......................... 73/660 |
| 4,683,542 | | 7/1987 | Taniguti ................................. 364/508 |
| 4,805,457 | | 2/1989 | Oates et al. ............................. 73/572 |
| 4,885,707 | | 12/1989 | Nichol et al. ..................... 364/551.01 |
| 4,894,644 | | 1/1990 | Thomas ................................. 340/680 |
| 4,980,844 | | 12/1990 | Demjanenko et al. ............. 364/550 |
| 5,008,703 | * | 4/1991 | Kawakami et al. .................. 355/53 |
| 5,058,434 | | 10/1991 | Zaschel ................................. 73/659 |
| 5,251,151 | | 10/1993 | Demjanenko et al. ............. 364/550 |
| 5,481,481 | * | 1/1996 | Frey et al. ............................. 702/82 |
| 5,610,339 | | 3/1997 | Haseley et al. ........................ 73/660 |
| 5,642,296 | | 6/1997 | Saxena ................................. 364/552 |
| 6,119,074 | * | 9/2000 | Sarangapani ........................ 702/185 |

* cited by examiner

*Primary Examiner*—Marc S. Hoff
*Assistant Examiner*—Craig Steven Miller
(74) *Attorney, Agent, or Firm*—Gray Cary Ware and Freidenrich, LLP (57) ABSTRACT

A system to diagnose potential malfunctions in semiconductor manufacturing equipment components, this system includes a transducer to monitor component vibration signatures of the semiconductor manufacturing equipment components. This transducer provides an output signal representative of the component vibration signature to an electrical circuit. The electrical circuit contains a transmitter which transmits via a carrier signal, a data signal representative of the output signal of the transducer. A computer system receives and stores the data signal. The computer system contains a software application to analyze the data signal and alert a user to differences between the data signal and a historical signal.

20 Claims, 5 Drawing Sheets

| Test 1 | One point beyond Zone A | detects a shift in the mean, an increase in the standard deviation, or a single aberration in the process. For interpreting Test 1, the R chart can be used to rule out increases in variation. |
|---|---|---|
| Test 2 | Nine points in a row in Zone C or beyond | detects a shift in the process mean. |
| Test 3 | Six points in a row steadily increasing or decreasing | detects a trend or drift in the process mean. Small trends are signaled by this test before Test 1. |
| Test 4 | Fourteen points in a row alternating up and down | detects systematic effects such as two alternately used machines, vendors, or operators. |
| Test 5 | Two out of three points in a row in Zone A or beyond | detects a shift in the process average or increase in the standard deviation. Any two out of three points provide a positive test. |
| Test 6 | Four out of five points in Zone B or beyond | detects a shift in the processing mean. Any four out of five points provide a positive test. |
| Test 7 | Fifteen points in a row in Zone C, above and below the center line | detects stratification of subgroups when the observations in a single subgroup come from various sources with different means. |
| Test 8 | Eight points in a row on both sides of the center line with none in Zone C | detects stratification of subgroups when the observations in one subgroup come from a single source, but subgroups come from different sources with different means. |

NON-INVASIVE SYSTEM AND METHOD FOR DIAGNOSING POTENTIAL MALFUNCTIONS OF SEMICONDUCTOR EQUIPMENT COMPONENTS

TECHNICAL FIELD OF THE INVENTION

The present invention relates generally to equipment diagnostic systems and methods, and more particularly, a system and method for non-invasively diagnosing potential malfunctions of semiconductor equipment components under vacuum, enabling a more efficient manner of inspecting moving mechanical parts in a vacuum system.

BACKGROUND OF THE INVENTION

Semiconductor manufacturing of integrated circuits is a long, complex, and expensive process. As new demands and technologies are introduced and integrated into semiconductor manufacturing the cost of manufacturing has only increased. A typical semiconductor manufacturing process may require between 200–300 steps. Since equipment malfunctions are inevitable, timely identification of these malfunctions is necessary to maintain profitability of the manufacturing process.

Figure 1:
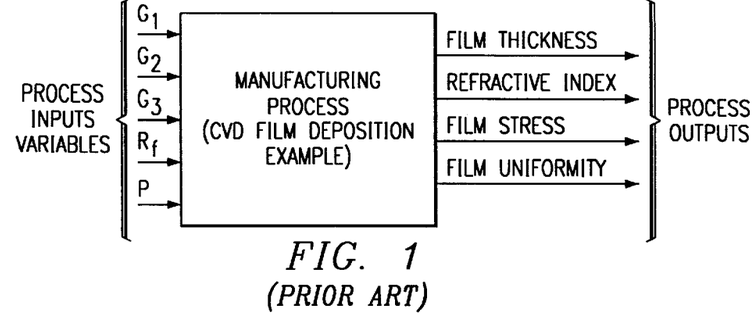
FIG. 1 illustrates an example of measured process inputs and output variables of a typical semiconductor process.

One solution, embraced by semiconductor manufacturers has been a structured approach in which a series of experiments is performed to understand equipment processing conditions. A typical example of this process is illustrated in FIG. 1. FIG. 1 represents a plasma enhanced chemical vapor deposition process. The process outputs of interest are the film thickness of the deposited films, film refractive index, stress on the wafer due to the deposited film, and the film non-uniformity. The process inputs manipulated to get the desired values of the outputs are, three gases G1, G2, G3; radio frequency (RF) power used to create the plasma; and the pressure in the vacuum chamber. Suppose that due to a miscalibration in one of the gas delivery systems the delivered gas flow is different from the requested flow. This could cause one or more of the process outputs to be different from the desired values. Since the future processing steps depend on previous steps, and the functionality of the integrated circuit relies on each set performing to specifications, one would like to quickly identify the miscalibrated gas flow and correct it before it prevents a large amount of semiconductor material from being correctly manufactured.

The diagnosis techniques described in this example make use of process models for fault isolation. Process models describe relationships between process inputs and outputs. Process models can be obtained by two main techniques. The first is by modeling the underlying physics of the process, resulting in physically based models. The second technique ignores the underlying physics but models the process implemented by the equipment as a "black box" by fitting a predetermined functional form to process outputs (responses) at carefully selected inputs. Such models are called response surface models (RSM) discussed in a book entitled Empirical Model-Building and Response Surfaces, published by John Wiley & Sons, New York, 1987. The diagnostic techniques described in this example invention have been tested on RSM models, but could in principle be applied to physically based models also.

Figure 2:
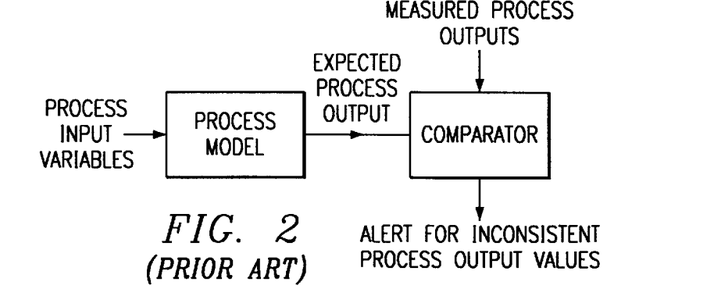
FIG. 2 is a simplified flow diagram comparing measured process outputs to expected process outputs.

This process model illustrated in FIG. 2, directly examines the process output of the equipment but only indirectly examines the operation of the equipment itself by determining the difference between the expected output and the actual output based on a set of measured process inputs. Furthermore this solution often requires sensors to violate internal pressure boundaries of the semiconductor equipment.

Measurement and analysis of vibration data is a well-known method of directly monitoring the operating condition of equipment. Vibration occurs as a normal by-product of the interaction of moving parts within equipment. An individual equipment component may produce a baseline vibration signature. Changes in the equipment component vibration signature indicate a change in the dynamic characteristics of the machine, often caused by a defect or deterioration of moving parts.

The prior art reveals several methods and apparatus for monitoring vibration. Some devices continuously monitor overall vibration in the time or frequency domain, and provide an indication of an alarm condition when preset vibration levels have been exceeded, (e.g., Shima et al., Judging System For Detecting Failure of Machine, U.S. Pat. No. 4,366,544, Dec. 28, 1982).

Another method of vibration analysis is "Vibration Signature Analysis," which is most often accomplished in the frequency domain. Under this method, time-domain vibration data are converted to the frequency domain using a Fourier Transform. The unique frequency spectrum obtained is often termed the "signature" of the machine. A signature of a machine under test may be analyzed and compared to a signature for a normal machine. Differences in the two spectra may indicate an abnormal condition. Prior art devices capable of providing a frequency spectrum are known. One such device includes a handheld probe for collecting vibration data, and the capability of executing a Fast Fourier Transform to provide a frequency spectrum, (e.g., Microlog IMS, available from Palomar Technology International, Carlsbad, Calif.). Morrow also discloses a data acquisition system which performs an automatic frequency spectrum analysis whenever a probable or actual malfunction is detected (Morrow, Data Acquisition System, U.S. Pat. No. 4,184,205, Jan. 15, 1980).

A common problem associated with most of the prior art monitoring equipment is that they usually require a human operator to analyze and compare the signatures.

Prior art inventions lack the sophisticated electronic circuitry and data processing necessary for automatic comparison of the spectra and for rendering a decision regarding the condition of the machine under test, with only minimal human interface.

Prior art inventions are also generally incapable of analyzing machines under transient conditions, and thus find applications restricted to steady state operation. Still other prior art devices are incapable of extracting events, or specific sections of interest in a typical vibration signal. Also, many prior art devices are large and bulky, or require interfacing with a mainframe computer. Finally, most prior art devices require the analysis equipment to be located proximate the machine element to be analyzed. For example, bearings on electric motors are typically monitored by placing sensing devices on the bearing housings themselves.

SUMMARY OF THE INVENTION

The present invention provides a non-invasive system and method for diagnosing potential malfunctions of semiconductor equipment components that substantially eliminates or reduces disadvantages and problems associated with previously developed semiconductor equipment diagnostic systems and methods used for diagnosing potential malfunctions.

More specifically, the present invention provides a system for diagnosing potential malfunctions in semiconductor manufacturing equipment components. The non-invasive system and method for diagnosing potential malfunctions of semiconductor equipment components includes a transducer to monitor present component vibration signatures of the semiconductor manufacturing equipment components and provide at least one output signal representative of present component vibration. This output signal is read by an electrical circuit and converted to a data signal. This data signal is transmitted by a transmitter coupled to the electrical circuit to a receiver coupled to a computer system. The computer system contains a software application to analyze the data signal representative of component vibration signatures. The software application will direct the collection of the data signal from the electrical circuit and store the data in a memory location. The software application will then transform the data into a present frequency spectrum for comparison. The software application will compare the present frequency spectrum to a baseline frequency spectrum, a series of frequency spectrums or a set of user defined or statistically defined limits. The software application will then generate a user alert noting differences found in the comparison.

The present invention provides an important technical advantage by establishing tool vibration base-line or signature. This is accomplished by recording.

The present invention provides another technical advantage by monitoring tool vibration and identifies any deviation from the base-line.

The present invention provides yet another technical advantage by analyzing data and notifying required personnel of repair action.

The present invention provides another technical advantage by vibration analysis of a vacuum pump indicates changes in vacuum load and exhaust. This provides a very sensitive tool to monitor the vacuum system process.

The present invention provides another technical advantage by eliminating catastrophic failure of equipment before more expensive damage occurs and preventing the loss of semiconductor product due to unscheduled equipment failure.

The present invention also reduces unscheduled down time for equipment repair or replacement by allowing a predictive schedule rather than unscheduled occurrences.

The present invention provides another technical advantage by providing a quality assurance check. New component installations/refurbishments can be checked against acceptance criteria and past performance.

The present invention provides another technical advantage by allowing replacements to be scheduled thus reducing equipment inventories.

The present invention provides another technical advantage by increasing mean time between failure (MTBF): root cause failures can be identified by using vibration data to evaluate cause and effect relationships.

The present invention provides another technical advantage by allowing better management of production schedules and resources resulting from known equipment condition.

The present invention provides another technical advantage by automating the data collection over an entire factory. Manual collection of this data would require some disassembly of some manufacturing tools. This repeated disassembly would generate additional particulate contamination in a clean room environment leading to depressed yields of manufactured product.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

The object of the present invention is to create a vibration analysis system that is both cost effective and functionally effective in predicting mechanical failures of semiconductor equipment components. Furthermore, the system should be easily installed with minimal impact on functioning equipment or incorporated into new equipment design.

FIG. 1 illustrates a semiconductor manufacturing process wherein the manufacturing equipment receives inputs such as gases G1, G2 and G3, RF power and pressure (P) and produces a plasma reaction wherein the measured outputs are stress, nonuniformity, refractive index and film thickness.

FIG. 2 is a flow diagram for a simplified monitoring system wherein the inputs to the manufacturing equipment are measured and recorded. These values are than inputted into a mathematical process model of the semiconductor manufacturing process to provide an expected value or range of values for the process outputs. The expected process outputs can be compared to the measured outputs. A significant difference between the expected and measured variables indicates that there may be: 1) a problem with the measured data, 2) a problem with the mathematical model representing the process, or 3) an indication that a problem exists within the process itself. The desired indication is that this system will identify a problem associated with the process. Unfortunately, since the measurements of the process outputs are typically performed after the process has been completed, the semiconductor product associated with poor measurements must be scrapped as unsatisfactory product at great expense.

The present invention presents a solution that reduces the risk of scrapping the semiconductor product by monitoring not only the process output variables but the semiconductor manufacturing equipment and its components moving pieces which are most likely to fail. These components typically are wheels, valves or bearings and the like.

Figure 3:
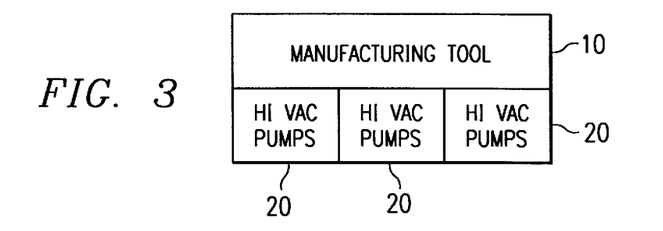
FIG. 3 provides a simplified rendition of a semiconductor processing tool and its components.

FIG. 3 presents a simplified semiconductor manufacturing equipment. Many semiconductor processes are conducted in a processing chamber or chambers 10 which are maintained at a vacuum. Hi-Vac pumps 20 are used to draw these vacuums. These pumps contain many high speed moving parts and historically have been the subject of unexpected processing equipment down time. Furthermore, the failure of these Hi-Vac pumps 20 during semiconductor processing can and does result in the costly scrapping of product.

Figure 4:
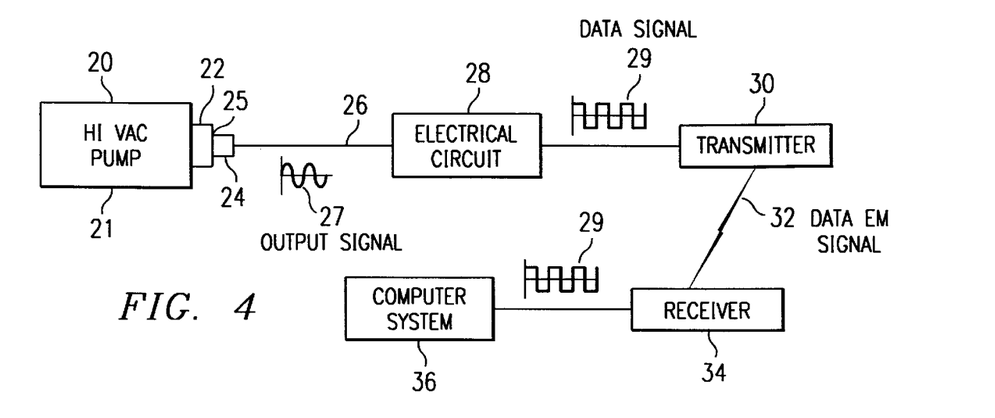
FIG. 4 illustrates an embodiment of the present invention to measure semiconductor equipment component vibration.

An embodiment of the present invention to directly monitor the performance of moving parts within these Hi-Vac pumps 20 is presented in FIG. 4. Hi-Vac pump 20 is equipped with one or more transducer mounts 22. These transducer mounts may be incorporated into the design of the pump casing 21 or affixed to the pump casing 21 after the pump has been manufactured and installed as part of the semiconductor manufacturing tool. The transducer mount(s) 22 can be positioned to provide orthogonal monitoring of the Hi-Vac pump 20 vibration along any axis of concern. The transducer 24 will be mounted on the transducer mount 22 with a mechanical clasp, glue bond, tape, magnetic or other bonding means connecting the transducer mount 22 to the mounting surface 25 of the transducer 24. The embodiment depicted in FIG. 4 uses an accelerometer for transducer 24.

Figure 5:
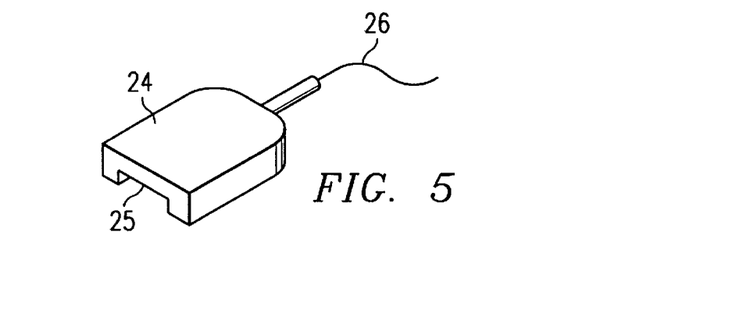
FIG. 5 is a three dimensional representation of a typical transducer.

A typical accelerometer is illustrated in FIG. 5. There are many variations of accelerometers. The basic function is to convert vibration or motion along an axis of concern into an electric signal that can be analyzed. Most vibration analysis is concerned with specific vibration levels and frequencies. Hence, complicated calibration schemes are developed to insure that the accelerometer is operating properly.

One embodiment of the present invention compares vibration data gathered using a set of transducers 24 to historical or baseline data gathered using the same set of transducers 24. Hence, the concern is repeatability, but not necessarily accuracy with respect to calibration standards. This embodiment of the present invention measures the change in vibration frequency and amplitude, not specific levels of vibration. Using this approach, embodiments of the present invention have been able to use accelerometers mass produced for automotive airbag operation and hence significantly lower in price.

The transducer 24 will generate an output signal 27 which can read by electrical circuit 28. Electrical circuit 28 is electrically connected to the transducer 24 with cable 26 attached at connection receptacle 38 shown in FIG. 6. Electrical circuit 28 will comprise a connection receptacle 38 to receive cable 26. The output signal 27 will be amplified, processed and converted into a data signal 29.

Figure 6:
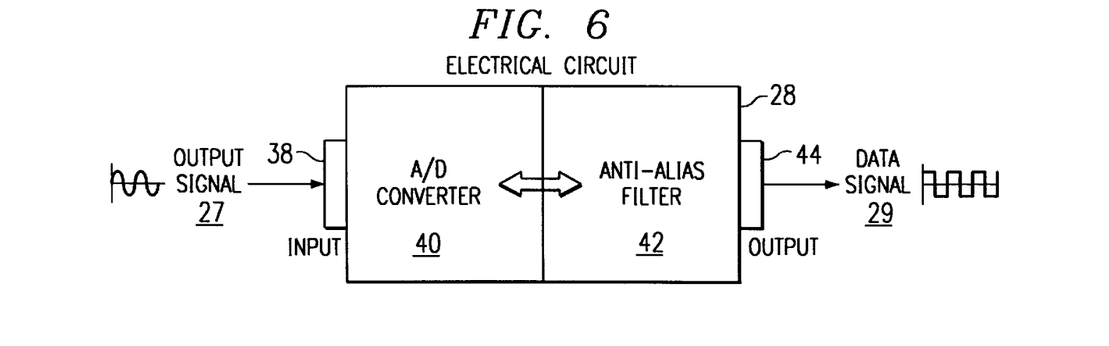
FIG. 6 provides a block diagram of the electrical circuit discussed in FIG. 4.

FIG. 6 shows the output signal 27 being converted into a digital data signal by an analog to digital converter 40 and then being filtered by anti-alias filter 42 to improve the signal to noise ratio of the data signal 29. Transmitter 30 is coupled to the output connection 44 to receive the data signal 29. Transmitter 30 will modulate an electromagnetic carrier signal 32 with data signal 29. This electromagnetic carrier signal may be a conventional radio wave, an optical signal transmitted with a laser with or without a fiber optic carrier, an infrared carrier signal or any other means as known by those skilled in the art of data transmission. The illustrated embodiment of the present invention utilizes wireless transmission of the electromagnetic carrier signal 32. However, the present invention need not be limited to wireless transmission. Wireless transmission facilitates installation of the present invention with minimal impact on the structure. Furthermore, digital radio technology has recently exploded with advances in cell phones and cordless phones. Transmitting large amounts of data accurately easily achieved as known by those skilled in the art.

Figure 11:
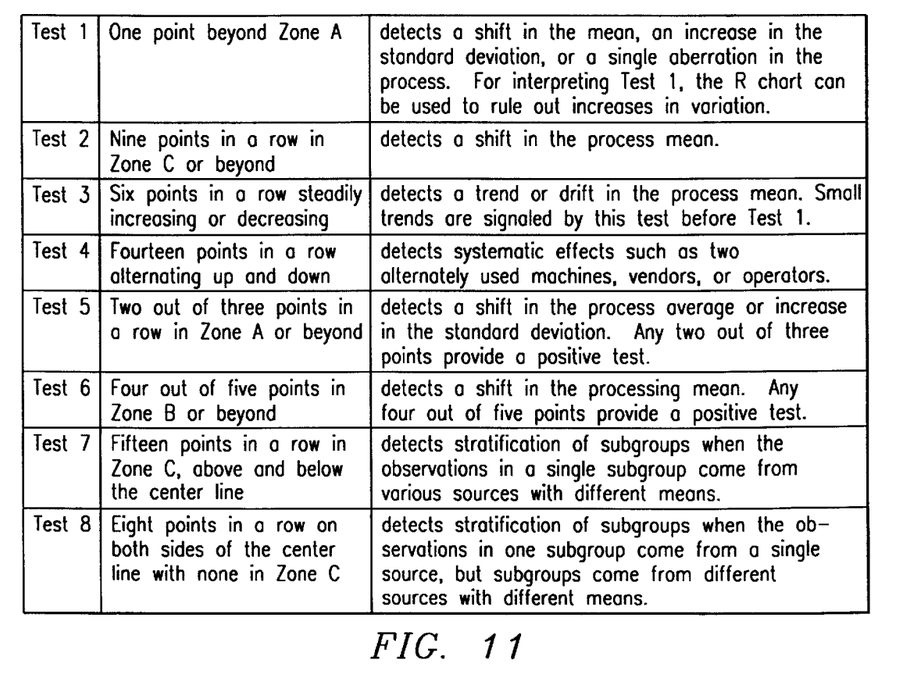
FIG. 11 is a flow diagram describing the operation of a software application used to evaluate frequency spectrums from semiconductor equipment components.

The electromagnetic carrier signal 32 will be collected and received by a receiving unit 34. The receiver 34 will contain a system to demodulate the data signal 29 from the electromagnetic carrier signal 32. A computer system 36 will configured with both hardware and software to process data signal 29 and extract the desired vibration data. This computer may include a storage device operable to store gathered data. A memory location which may store the software application, coupled to a processor and storage device wherein the processor can execute the software application. One embodiment of this process is presented in FIG. 11.

Figure 7:
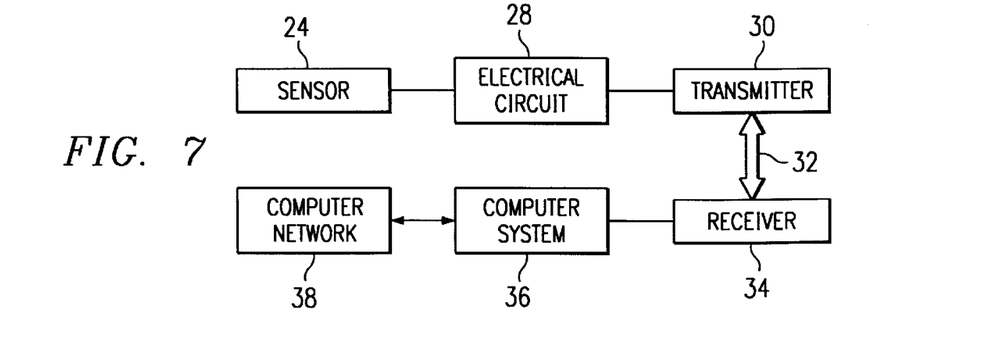
FIG. 7 shows a second embodiment of the present invention to measure semiconductor equipment component vibration coupled to a computer network.

FIG. 7 presents an embodiment of the present invention similar to that described in FIG. 4 with the addition of an interface between the computer system 36 to a computer network 38 wherein a user 39 may have broader access to the data and analysis.

Figure 8:
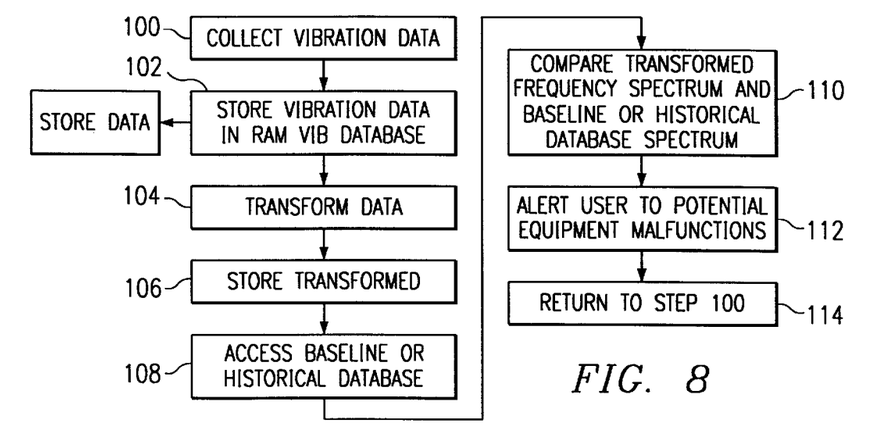
FIG. 8 illustrates a Frequency Amplitude Spectrum for a typical semiconductor equipment component.

FIG. 8 presents a flow diagram of a process used by the software to evaluate the vibration data gathered by the present invention. First in step 100 the vibration data is collected on a periodic basis (hourly, shiftly, daily, etc.) from a semiconductor equipment component as illustrated by the Hi-Vac pump 20 and supplied to the computer system 36 as described above. The raw vibration data may be stored in a raw vibration data database in step 102 and identified with the time and equipment component from which the data was collected. In step 103, the raw vibration data may be saved for future analysis.

Step 104 is the transformation of the raw vibration data using various mathematical techniques—Fast Fourier Transform, Gabor Transform, Wavelet Transform and the like as known by those skilled in the art—to produce a first frequency spectrum. An individual machine may have a unique frequency spectrum or signature comprising vibrational amplitude and frequency over time. Vibration energy is identified by frequency, time, and amplitude as illustrated by FIG. 9.

Figure 9:
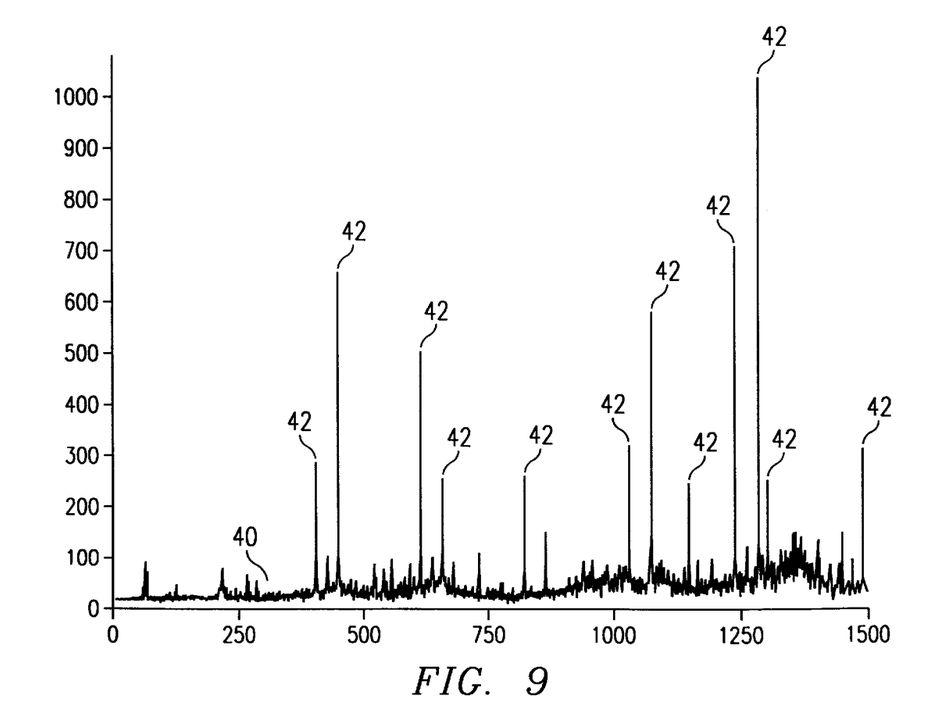
FIG. 9 annotates frequency spikes which may indicate potential equipment component failures.
Figure 10:
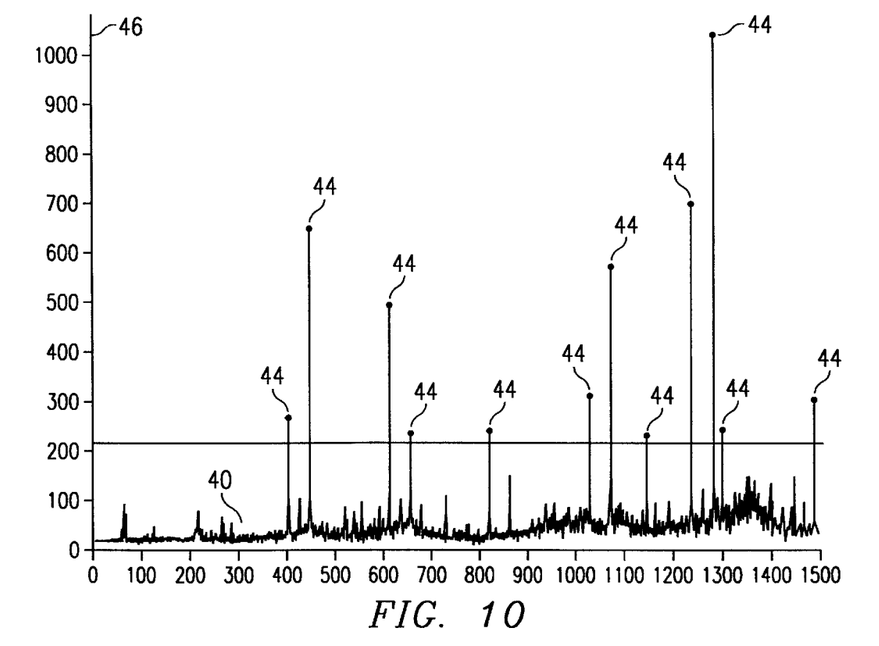
FIG. 10 illustrates a time series of events which effect measured vibration amplitudes and there assigned causes.

FIG. 9 presents a typical frequency spectrum 40 taken at a discrete moment in time. This spectrum presents the equipment components vibration amplitude on the y axis and frequency on the x axis. Amplitude spikes 42 represent tonals associated with the equipment components. A tonal may be defined as a vibration at a specific frequency. A set of tonals may be characteristic of the operation of an individual piece of equipment. By comparing several frequency spectrums, one can observe vibration changes with respect to time.

The frequency spectrums can then be stored in a temporary location of the historical database in step 106.

This historical database will contain a baseline frequency spectrum, recently gathered frequency spectrums as well as a location for user defined or a means for performing statistical analysis. This historical database is than accessed in step 108 for a set of values to which the present frequency may be compared.

Step 110 compares the first frequency spectrum to the baseline frequency spectrum, to a series of historical frequency spectrums or to a set of limits derived from historical or empirical data. This comparison may for example consist of calculating the euclidian distances between the individual points comprising the first frequency spectrum and the baseline spectrum or an average spectrum based on historical data.

Step 110 alerts the user to potential malfunctions. There are several ways a potential malfunction may be identified.

FIG. 9 illustrates an embodiment of the present invention where a user defined limit 45 has been set and the amplitude spikes 44 would be noted as differences. The user in this embodiment would be informed of such spikes. This embodiment only illustrates the comparison to one limit. However, the present invention may involve a series of limits either present or based on a comparison of euclidian distances between each individual data point of the frequency spectrum to a prior spectrum.

Another method of comparison may involve a statistical analysis on the first frequency spectrum to a series of historical frequency spectrums according to a set of statistical process control rules such as the Western Electric Rules (shown in FIG. 11) presented by Nelson in "The Shewhart Control Chart—Tests for Special Causes," Journal of Quality Control Technology (1984) and the like. Further, the series of historical frequency spectrums may be used to determine statistical limits for each individual data point on the frequency spectrum. The statistical methods used need not be limited to those of the Western Electric Rules; there are a variety of methods for conducting statistical analysis as known to those skilled in the art.

When a limit is exceeded as depicted in FIG. 9, the computer will generate a warning or alarm to the user as illustrated in Step 112. Similarly the computer may generate a non alert indicating that the comparisons have been performed with no discrepancies.

The present invention also allows for the gathering of vibrational data during a specific functions of the semiconductor equipment. This allows the vibration not only of a component to be observed, but also the vibration signature of a specific the evolution to be observed.

Figure 12:
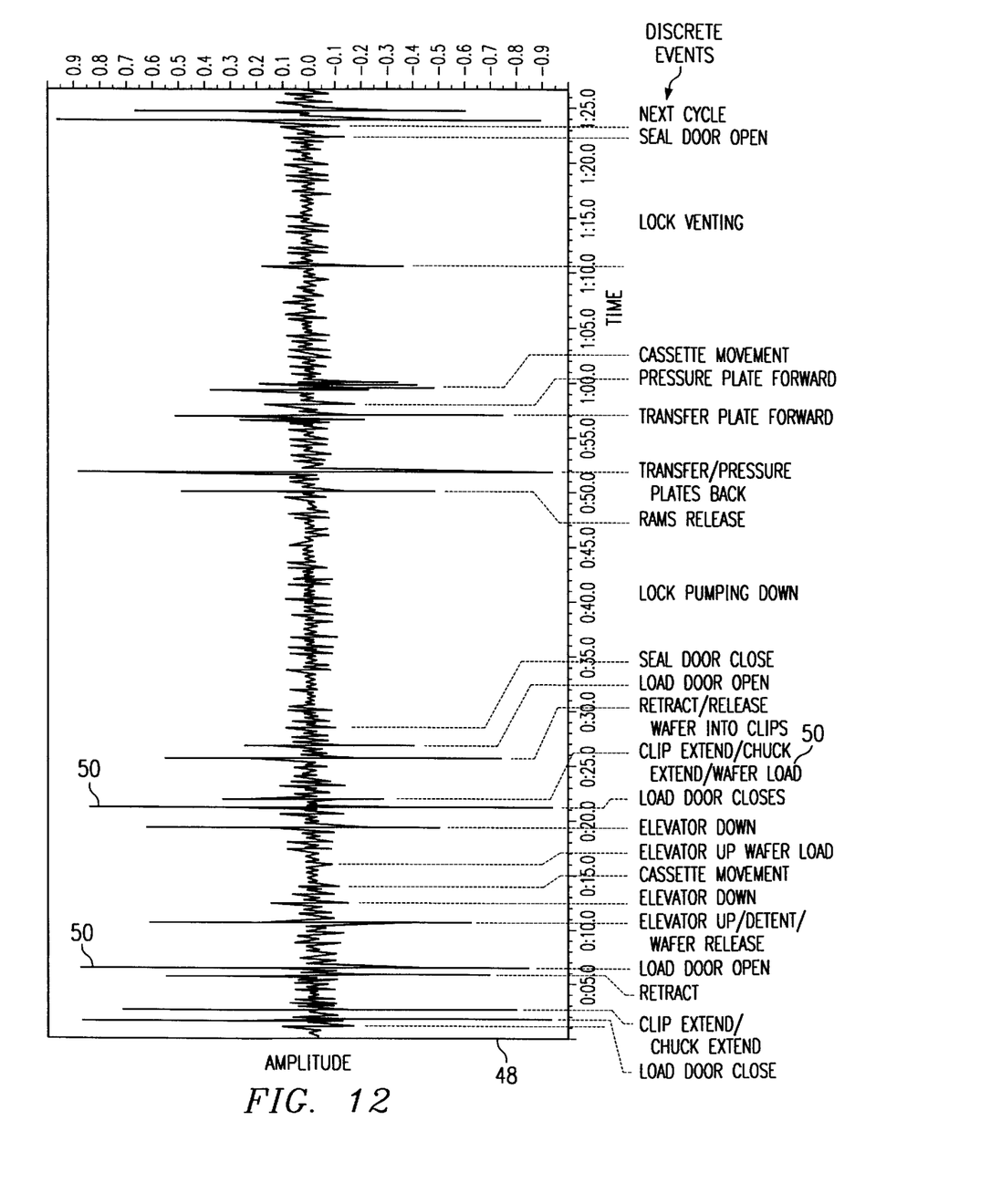
FIG. 12 presents a table of the Western Electric rules for statistical control.

A time series of vibrational amplitudes or waterfall plot is presented in FIG. 12 for typical semiconductor manufacturing tool. The graph presents amplitude on the y axis and time on the x axis. Events are illustrated and marked on the x axis. These events describe functions and movements inside the processing chamber 10 of a typical semiconductor equipment. However, these events need not be limited to functions within the processing chamber.

The present invention may analyze the vibrational signature of the evolution and compare that signature to a baseline or historical signature for the evolution and alert a user of required maintenance.

In summary, the present invention provides a noninvasive system and method for diagnosing potential malfunctions of semiconductor equipment components that diagnoses potential malfunctions in semiconductor manufacturing equipment components.

The present invention provides several benefits including providing a means to establishing a semiconductor equipment component vibration base-line signature. Further, the present invention allows the semiconductor equipment component vibration signature to be monitored and for deviations from the semiconductor equipment component vibration base-line signature to be analyzed and used to notify required personnel of upcoming required repair action. This will reduce spare parts inventories and unscheduled down time for equipment repair or replacement by allowing a predictive schedule for maintenance rather than a reaction to an unscheduled failure. This predictive schedule will also allow a more efficient use of repair personnel manpower. Further, this predictive scheduling ability may eliminate catastrophic failure of equipment before more expensive damage occur and prevent the loss of semiconductor product due to unscheduled equipment failure.

The present invention also evaluates and monitors impact from structural, environment, or system load changes. The vibration signature can be monitored during specific functions or load conditions within the semiconductor equipment.

Additionally, the present invention provides a method of providing a quality assurance check. New installations/refurbishments can be checked against acceptance criteria and past component or tool performance.

Although the present invention has been described in detail, it should be understood that various changes, substitutions and alterations can be made hereto without departing from the spirit and scope of the invention as described by the appended claims.

What is claimed is:

1. A system to diagnose potential malfunctions in semiconductor manufacturing equipment components, comprising:
   a transducer to monitor present component vibration signatures of the semiconductor manufacturing equipment components and provide at least one output signal representative of present component vibration;
   an electrical circuit to read said at least one output signal generated by said transducer and transmit at least one data signal representative of said present component vibration signatures to a computer system; and
   a computer system which contains a software application to analyze said at least one data signal wherein said software application comprises:
      a set of instructions operable to direct said computer to collect said at least one data signal, store data representative of said present vibration signatures in a memory location, and
      compare said data to a database of historical component vibration signatures wherein an alert is supplied to a user noting differences between said present component vibration signatures and the historical component vibration signatures.

2. The system of claim 1, wherein said transducer comprises an accelerometer along an axis of concern.

3. The system of claim 1, wherein said electrical circuit further comprises a radio transmitter to transmit said at least one data signal to said computer, and wherein said computer system further comprises a radio receiver to receive said at least one data signal.

4. The system of claim 1, wherein the semiconductor manufacturing equipment component is a vacuum pump or vacuum system.

5. The system of claim 1, wherein said transducer is removably mounted to the semiconductor manufacturing equipment components external to any pressure boundaries of the semiconductor manufacturing equipment components.

6. The system of claim 1, wherein said database of historical component vibration signatures comprises a plurality of historical component vibration signatures representing different operating conditions of the semiconductor manufacturing equipment component.

7. The system of claim 1, wherein said software objects transforms said data representative of said present component vibration signatures and said historical component vibration signatures to spectrums of frequency and amplitude over time with a plurality of transformation techniques comprising:
   fast fourier transforms;
   wavelet transforms; and
   gabor transforms.

8. The system of claim 1, wherein said software application utilizes a plurality of statistical techniques to compare present component vibration signatures and historical component vibration signatures comprising:
   Euclidean distances between corresponding values of present and historical component vibration signatures; and
   western electric rules.

9. The system of claim 1, wherein said transducer monitors vibrations between 0 and 20,000 hertz.

10. The system of claim 1, wherein said electrical circuit further comprises a filter to anti-alias said at least one data signal representative of said present component vibration signatures wherein said at least one data signal is an analog signal.

11. The system of claim 1, wherein each present and historical component vibration mechanical signature contains a unique component identifier, and wherein said computer collects said present component vibration signatures from a plurality of semiconductor manufacturing components for analysis.

12. The system of claim 1, wherein said computer is accessible from a local area network.

13. The system of claim 1, wherein said electrical circuit transmits said at least one data signal to said computer with a carrier electromagnetic signal of any kind.

14. A system to diagnose potential malfunctions in semiconductor manufacturing equipment components, comprising:
- a transducer to monitor present component vibration signatures of the semiconductor manufacturing equipment components between 0 and 20,000 hertz, and provide at least one output signal representative of present component vibration, and wherein said transducer comprises an accelerometer removably mounted external to semiconductor manufacturing equipment components pressure boundaries of the semiconductor manufacturing equipment components along an exist of concern;
- an electrical circuit to read said at least one output signal generated by said transducer, filter said at least one output signal to improve signal-to-noise ratio and transmit with an electromagnetic carrier signal of any kind at least one data signal representative of said present component vibration signatures to a computer system; and
- a computer which contains a software application to analyze said at least one data signal representative of said present component vibration signatures wherein said software application comprises:
  - a memory module containing a database of historical component vibration signatures, and wherein comprises a plurality of historical component vibration signatures representing different operating conditions of semiconductor manufacturing equipment components;
  - a first module operable to direct said computer to collect said at least one data signal representative of said present component vibration signatures from said electrical circuit and store data representative of said present component vibration signatures in a memory location; and
  - a second module operable to compare said data representative of said present component vibration signatures to a database of historical component vibration signatures wherein an alert is supplied to a user noting differences between said present component vibration signatures and the historical component vibration signatures, and wherein said second software module transforms said data representative of said present component vibration signatures and said historical component vibration signatures to spectrums of frequency and amplitude over time with a plurality of transformation techniques comprising:
    - fast fourier transforms;
    - wavelet transforms; and
    - gabor transforms.

15. The system of claim 14, wherein said electrical circuit further comprises a radio transmitter to transmit said at least one data signal to said computer, and wherein said computer system further comprises a radio receiver to receive said at least one data signal.

16. The system of claim 14, wherein said software application utilizes a plurality of statistical techniques to compare present component vibration signatures and historical component vibration signatures comprising:
- Euclidean distances between corresponding values of present and historical component vibration signatures; and
- western electric rules.

17. A method for diagnosing potential malfunctions in semiconductor manufacturing equipment components, comprising the steps of:
- monitoring component vibration signatures of the semiconductor manufacturing equipment components with a transducer wherein said transducer is an accelerometer removably mounted external to semiconductor manufacturing equipment components pressure boundaries along an axis of concern;
- providing at least one output signal representative of present component vibration from said transducer to an electrical circuit;
- reading said at least one output signal generated by said transducer with said electrical circuit;
- filtering with said electrical circuit said at least one output signal to improve signal-to-noise ratio and provide a data signal representative of present component vibration;
- transmitting on an electromagnetic carrier signal of any kind said data signal representative of said present component vibration signatures to a computer system;
- receiving said data signal at said computer system;
- storing said data signal in a memory location in said computer system;
- transforming said data signal to spectrums of frequency and amplitude over time with a plurality of transformation techniques comprising:
  - fast fourier transforms;
  - wavelet transforms; and
  - gabor transforms;
  - comparing said spectrums to a historical spectrum of the semiconductor equipment component; and
  - alerting a user to potential malfunctions of the semiconductor equipment component based on differences between said spectrums and said historical spectrum.

18. The method of claim 17, wherein the step of comparing said spectrums further comprises the steps of:
- selecting said historical spectrum from a historical database of spectrums for the semiconductor equipment component, and wherein said historical spectrum selected was recorded under similar operating conditions; and
- comparing said spectrum and said historical spectrum with a plurality of statistical techniques comprising:
  - Euclidean distances between corresponding values of present and historical component vibration signatures; and
  - western electric rules.

19. The method of claim 17, wherein the step of transmitting on an electromagnetic carrier signal of any kind said data signal further comprises using a radio transmitter to transmit said electromagnetic carrier signal.

20. The method of claim 17, wherein said computer system receives a plurality of data signals representing vibration signatures from a plurality of semiconductor of semiconductor equipment components.

* * * * *